United States Patent [19]

Jayakumar

[11] Patent Number: 4,812,797

[45] Date of Patent: Mar. 14, 1989

[54] COMPENSATION COIL FOR TEMPORAL DRIFT OF A SUPERCONDUCTING MAGNET

[75] Inventor: Raghavan Jayakumar, Florence, S.C.

[73] Assignee: General Electric Company, Milwaukee, Wis.

[21] Appl. No.: 171,824

[22] Filed: Mar. 22, 1988

[51] Int. Cl.$^4$ .............................................. H01F 5/00
[52] U.S. Cl. .................................... 335/299; 324/320
[58] Field of Search ............... 335/299, 216; 324/318, 324/319, 320

[56] References Cited

U.S. PATENT DOCUMENTS

| | | | |
|---|---|---|---|
| 4,398,150 | 8/1983 | Barihoux et al. | 335/299 X |
| 4,500,860 | 2/1985 | Vermilyea | 335/216 |
| 4,581,580 | 4/1986 | Keim | 324/318 |
| 4,647,858 | 3/1987 | Bottomley | 324/320 |
| 4,656,447 | 4/1987 | Keim et al. | 335/216 |
| 4,680,551 | 7/1987 | O'Donnell et al. | 324/320 |
| 4,689,591 | 8/1987 | McDougall | 335/299 |
| 4,701,736 | 10/1987 | McDougall et al. | 335/216 X |

Primary Examiner—George Harris
Attorney, Agent, or Firm—Quarles & Brady

[57] ABSTRACT

A superconducting coil assembly for a nuclear magnetic resonance imaging system has a main coil for producing a static magnetic field within a cylindrical volume. a conventional set of active correction coils are provided to spatially homogenize the magnetic field. A pair of passive compensation coils are electrically connected in series and shorted together. The compensaton coils are inductively coupled to the main coil so that the temporal decay of the current in the main coil induces current in the compensation coils. The magnetic field harmonics produced by this induced current is opposed to the magnetic field harmonics produced in the correction coils by main coil decay. The compensation coil thereby counteracts the inhomogeneity effects from the main coil current decay.

7 Claims, 1 Drawing Sheet

COMPENSATION COIL FOR TEMPORAL DRIFT OF A SUPERCONDUCTING MAGNET

BACKGROUND OF THE INVENTION

The present invention relates to magnetic coils for producing highly uniform magnetic fields, such as those required for nuclear magnetic resonance imaging, and particularly to apparatus for compensating for inhomogeneity of the magnetic field produced by a superconducting coil.

Nuclear magnetic resonance (NMR) imaging requires that a static magnetic field, $B_o$, be developed which is relatively homogeneous (having a constant magnitude) throughout a defined volume. In NMR systems for whole body medical diagnostic imaging, the $B_o$ magnetic field strength typically ranges from about 0.04 to about 1.5 Tesla or more. This magnetic field establishes nuclear spin precession distribution in the patient. Subsequent radio frequency radiation from excited atomic nuclei in the patient are received and employed to produce imaging data. If the static magnetic field is significantly inhomogeneous, undesirable artifacts will occur in the image data.

The uniform magnetic field is developed by a main magnetic coil and several active correction coils which are disposed on a cylindrical surface. In an NMR imaging system, these coils are contained in a cryogenic chamber so that they become superconducting. The magnetic field produced by the coils is oriented in an axial direction with respect to the hollow cylinder on which the coils are disposed. The main magnetic coil is designed to produce as uniform a field as is practical. However, even when extraordinary steps are taken to ensure proper construction of the main coil and magnetic field uniformity, some spatial field uniformity errors remain. Accordingly, it is conventional practice to employ relatively low power active correction coils to perturb the state magnetic field from the main coil in a manner which increases the overall field homogeneity.

A method for homogenizing the magnetic field is taught by U.S. Pat. No. 4,680,551. Initially, the main superconducting coil is excited by a current source and then short circuited so that the excitation current continues to flow through the main coil. Then, the magnetic field magnitude is measured throughout the interior volume of the cylinder. The measurements are used by a correction algorithm in a computer to determine the field inhomogeneity and the magnitude of the current necessary to excite each of the correction coils to improve the homogeneity of the field. The results of this computation indicate the magnitude of the excitation current to be applied to the correction coils. Each of the superconducting correction coils is excited and then short circuited. Once the highly homogeneous magnetic field has been so established, the NMR coils are maintained in the superconducting state for months at a time.

All superconducting coils have a small but finite resistance and as a result, the coil currents decay slowly over time. This decay causes a drift in the static magnetic field within the cylindrical volume. The field drift due to the main coil current decay induces additional currents in the correction coils which produces a change in their magnetic flux that opposes the field drift. Consequently, the perceived temporal magnetic field drift of the coil assembly is very slow which is beneficial for NMR imaging where high temporal stability of the static field is desirable.

However, the alteration of the magnetic flux produced by the additional current induced in the correction coils changes their contribution to the correction of the magnetic field from the main coil. Consequently, over a long period, the drift induced currents in the correction coils degrade the homogeneity of the $B_o$ magnetic field within the cylinder. As a result, a service technician must periodically go through the laborious and expensive process of measuring the field throughout the cylinder and re-exciting the correction coils to homogenize the $B_o$ field. Therefore, it is desirable to further compensate for the magnetic field drift to prolong the period between adjustment of the correction coils.

SUMMARY OF THE INVENTION

A coil assembly for an NMR imaging system includes a main coil for establishing a static magnetic field within the imaging region. A set of correction coils are provided to adjust for spatial inhomogeneity in the magnetic field. A compensation coil means is inductively coupled to the set of correction coils for compensating for the induced inhomogeneity due to temporal drifts of the magnetic field.

In the preferred embodiment, the compensation coil means includes two windings which are axisymmetrically positioned with respect to the imaging region. The two windings are connected in a short circuit series connection. The compensation coil is positioned so that the correction magnetic fields produced by the current induced in the compensation coil by current decay in the main coil will oppose changes in the correction magnetic fields from the correction coils due to that current decay.

The general object of the present invention is to provide a coil assembly that produces a spatially and temporally uniform magnetic field.

An object is to compensate for the effects of current decay in the main superconducting coil.

Another object is to provide such an assembly having a coil means which compensates for drifts in the magnetic field over time.

A further object is to provide such magnetic field compensation with an arrangement of static coils.

DETAILED DESCRIPTION OF THE INVENTION

Figure 1:
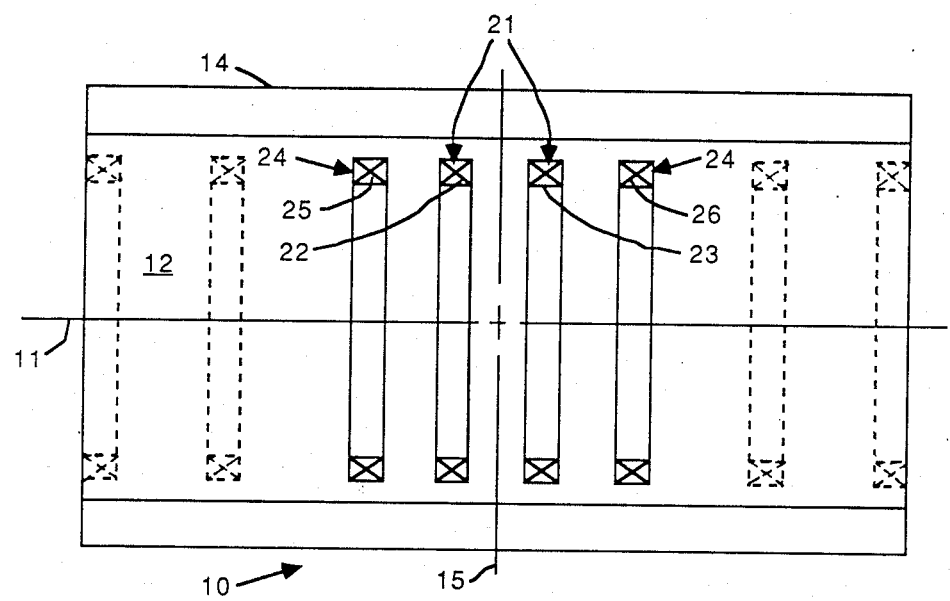
FIG. 1 is an axial cross section view of the novel coil assembly for an NMR imaging system.

A coil assembly 10 for an NMR imaging system shown in FIG. 1. The assembly is formed by a plurality of superconducting coils which in the imaging system are enclosed in a conventional hollow cylindrical cryostat chamber. As this chamber is of conventional design, it has not been shown for ease of illustrating the elements of the present invention. The coil assembly has a general cylindrical shape about longitudinal axis 11, defining an interior volume 12 in which the patient being imaged is placed.

The assembly 10 has a conventional main superconducting coil 14 providing a static magnetic field, generally referred to as the $B_o$ field, of a desired magnitude, e.g. 1.5 Tesla. The main coil 14 is coaxial about the longitudinal axis 11 and has a axial median 15. The main coil comprises either a single winding extending the entire length of the coil assembly or a number of axially spaced individual windings connected in series. The main coil 14 is coupled to a superconducting switch enabling the coil to be coupled to a direct current excitation source or shorted.

As is well known, the deviation of the axial component of the magnetic field produced by a coil assembly along the longitudinal axis symmetric with respect to a median (z=0) can be expressed by the equation:

$$B_z(z,0) = B_0\{1 + E_2(z/r)^2 + E_4(z/r)^4 + E_6(z/r)^6 + \ldots\}$$

Where $E_x$ is the coil error coefficient for each term of the equation, Z is the distance along the axis and a is the coil radius. As each term is raised to an even power, it is commonly referred to as an even harmonic term.

In order to correct for the spatial deviation from non-uniformity of the magnetic field, a superconducting correction coil set 21 having windings 22 and 23 is located within the main coil 14. The two windings 22 and 23 are wound in the same direction and are connected in series so that their magnetic polarities are in the same direction. The correction coil set 21 is connected to a superconducting switch (not shown) so that the coil alternatively can be coupled to a direct current source or can be shorted in a superconducting state. The correction coil set 21 is positioned within the volume 12 symmetrically about the median 15 to produce a shimming magnetic field that corrects for the spatial variation of the static magnetic field along the axis 11, as represented by a specific even harmonic term of the above equation, for example the second (2,0) harmonic. Additional axial correction coils can be provided to counter other even harmonic terms as illustrated by phantom lines in FIG. 1. Although only coaxial correction coils are shown, the present invention is not limited to use in an assembly employing coaxial correction coils or a given number of correction coils.

In order to compensate for the effects of temporal drifts of the static magnetic field due to the decay of current in the main coil 14, a compensation coil 24 is included in assembly 10. The compensation coil 24 includes two windings 25 and 26 which are coaxially positioned about axis 11 symmetrical with respect to the median 15. The windings 25 and 26 are wound in the same direction and are connected in series so that their polarities are the same. The compensation coil 24 is wound to produce the same magnetic field polarity as the correction coils. However by selecting an appropriate location of the compensation coil windings along axis 11 the sign of the magnetic field harmonic term will be opposite to that of the correction coil set 21. Therefore, the magnetic field produced by current induced in the compensation coil 24 will be opposed to the shim fields produced by the correction coils. Unlike the correction coil set 21, the compensation coil 24 is permanently shorted so that it is passive, i.e. no excitation signal is applied to it. In addition, the compensation coil 24 provides a compensation of the drift in the fundamental ($Z_o$) field so that the perceived drift is smaller.

The functionality of the embodiment illustrated in FIG. 1 is best described in terms of a specific structural example. In order to simplify the explanation, this example will consider the coil assembly as having only one correction coil set 21. The main coil 14 has an average radius of about 60 cm. and consists of six windings with a total of 2000 turns. The first correction coil 21 has an average radius of approximately 56 cm. and a 100 turns in its combined windings 23 and 24. Each winding 23 and 24' is spaced about 17 cm. on either side of the median 15 of the coil assembly 10. The self inductances of the main coil 14 and the correction coil set 21 are calculated to be approximately 12.3 Henry and 0.055 Henry, respectively and their mutual inductance is about 0.051 Henry. The compensation coil 24 has an average radius of about 56 cm. and a total of 100 turns. Each winding 25 and 26 of the compensation coil is spaced 41.5 cm. on either side of the median 15. When the additional correction coil sets are incorporated into assembly 10, their self and mutual inductances are similarly determined.

When the coil assembly 10 is placed in operation, an excitation current is fed through the main coil 14 and the superconductive switch is activated to short the coil. Because of the main coil's superconductive state, the current continues to flow through this shorted coil. Using well known techniques, such as those described in U.S. Pat. No. 4,680,551, the excitation current for the correction coil set 21 is determined and applied to it. Once this superconductive coil set 21 has been excited, it too is shorted.

Although the coil assembly 10 is maintained in a superconducting state, the currents flowing through the main coil 14 and the correction coil set 21 decay over time. As the excitation current in the main coil is the greatest, the effect of its current decay on magnetic field homogeneity will be the most significant. Initially, consider only the effects of the main coil current decay on a coil assembly without the compensation coil 24. In the specific example above, for each ampere of current decay in the main coil 14, 6.4 amperes will be induced in the correction coil set 21 which increases the magnetic flux generated by the correction coil. This increase in the correction coil flux counters the decrease in the magnetic flux from the main coil to produce a total magnetic field compensation of approximately 58% or a compensation factor of 2.4. When the effective reduced inductance of the main coil 14 is taken into account, the effective compensation factor of the main coil field change is 1.9. However, the induced current in the correction coil 21 produces about 1.9 Gauss of the (2,0) harmonic of the magnetic field per ampere change in the main coil's current. This increases the inhomogeneity of the magnetic field within volume 12.

When the effects of the compensation coil 24 are considered in this example, the correction coil set 21 produces a 43% field compensation and the compensation coil 24 produces a 28% compensating field. The resultant real compensation thereby increases to a factor of 3.5 and the effective compensation increases to a factor of 2.4. In addition, the correction coil set 21 produces a 1.6 Gauss change in the (2,0) magnetic field harmonic for each one ampere change in the main coil current. The compensation coil 24 produces a 0.85 Gauss (2,0) magnetic field harmonic of the opposite polarity, resulting in a net variation of only 0.75 Gauss per ampere change of the current in the main coil 14. This is a dramatic decrease from the 1.9 Gauss change in the field per ampere in a coil assembly without the correction coil 24. Therefore, the introduction of the static compensation coil 24 has increased the temporal drift compensation while decreasing the effect that such compensation has on the spatial homogeneity of the field.

Now that the functionality of the compensation coil 24 is understood, the determination of its location can be described. The axial position of the compensation coil 24 is determined by first calculating the mutual inductances between it and the correction coil set 21 and any additional correction coils. The compensation coil 26 is axially positioned so that the dominant magnetic field harmonics produced by currents induced in the coil by the main coil current drift are of opposite sign to the harmonics produced by current induced in the correction coil(s). Under such conditions, the net inhomogeneity induced by the main coil can be minimized. Then, the effects produced by a given change in the main coil current are derived empirically by calculating the magnetic field within the volume 12 for different excitation currents in the main coil 14. The position of the compensation coil 24 is varied and the process is repeated to locate the optimum position where the effects of current decay on the magnetic field are minimized. This determination is made for each coil assembly design. If there are several axial correction coils, a single passive compensation coil is positioned to oppose the sum of the induced inhomogeneity from the correction coils.

Figure 2:
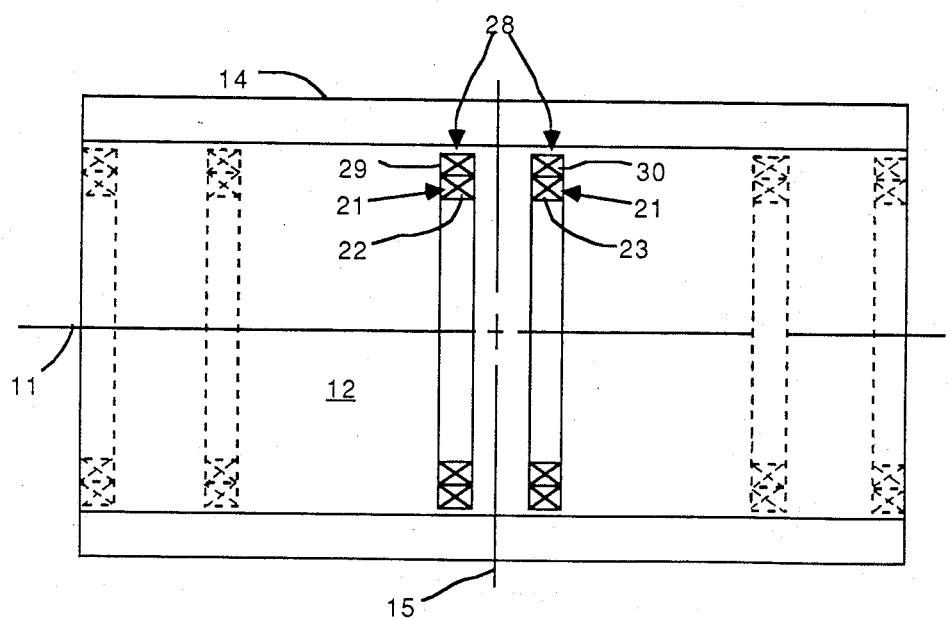
FIG. 2 is an axial cross section view of an alternative embodiment of the novel coil assembly.

FIG. 2 illustrates an alternative compensation coil placement. In this embodiment the main coil 14 and the correction coil set 21 are positioned as in the first embodiment. However, the compensation coil 28 has windings 29 and 30 wound at the same location as the windings 22 and 23 of the correction coil 21. The compensation coil 28 has opposite polarity to that of the correction coil set 21 so that the magnetic flux produced by induced currents in these coils 21 and 28 will counteract each other. The induced inhomogeneity from the correction coil set 21 is cancelled by the field from the compensation coil 28, effectively uncoupling the correction coil from the main coil 14.

If additional correction coils are incorporated in the coil assembly 10, each one can have a matching compensation coil. However, in such a case, the set of correction coils and the set of compensation coils produce opposing contributions to the compensation of the drift in the fundamental ($Z_o$) magnetic field also. Therefore, the perceived main field drift will be higher, if induced currents in the set of correction coils compensate for the main field drift.

I claim:

1. A coil assembly for an NMR imaging system comprising:
    a main coil means for producing a magnetic field within a region;
    a correction coil means for correcting spatial inhomogeneity in the magnetic field produced by said main coil means, said correction coil means being inductively coupled to said main coil means; and
    a compensation coil means inductively coupled to said main coil means so that temporal decay of the main coil current produces a magnetic field harmonic component from said compensation coil means that is opposed to a magnetic field harmonic component produced by the correction coil due to the decay.

2. The coil assembly as recited in claim 1 wherein said compensation coil means comprises two windings electrically connected in series and shorted together.

3. The coil assembly as recited in claim 2 wherein the two windings are axisymmetric with respect to the longitudinal axis of said main coil means.

4. The coil assembly as recited in claim 2 wherein the two windings are colocated with said correction coil means.

5. A coil assembly for establishing a static, highly uniform magnetic field comprising:
    an active main magnetic coil means for producing a magnetic field within a cylindrical volume having a longitudinal axis;
    an active correction coil means for correcting spatial inhomogeneity of the magnetic field within the volume; and
    a passive compensation coil means for compensating for the inhomogeneity of the magnetic field within the volume that results from temporal drift of the magnetic field, said compensation coil means being inductively coupled to said main magnetic coil means.

6. The coil assembly as recited in claim 5 wherein said compensation coil means includes two coil windings coaxial about the longitudinal axis, the windings being connected in series and shorted.

7. The coil assembly as recited in claim 6 wherein the two windings are symetrically located with respect to a median of the cylindrical volume.

* * * * *